United States Patent
Nordstrom et al.

(10) Patent No.: US 8,067,718 B2
(45) Date of Patent: Nov. 29, 2011

(54) METHOD AND APPARATUS FOR PROBING

(75) Inventors: Robert A. Nordstrom, Beaverton, OR (US); William Q. Law, Beaverton, OR (US); Mark W. Nightingale, Portland, OR (US); Einar O. Traa, Portland, OR (US); Ira G. Pollock, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 810 days.

(21) Appl. No.: 11/418,994

(22) Filed: May 4, 2006

(65) Prior Publication Data

US 2007/0257025 A1 Nov. 8, 2007

(51) Int. Cl.
*H05B 1/02* (2006.01)

(52) U.S. Cl. ... 219/501; 219/494; 219/497; 324/756.03; 324/754.1; 324/754.08

(58) Field of Classification Search ............. 219/494, 219/497, 121.43, 492, 501; 324/754–756, 324/763
See application file for complete search history.

(56) References Cited

U.S. PATENT DOCUMENTS

| | | | | |
|---|---|---|---|---|
| 3,872,408 A * | 3/1975 | Reilly | ............ | 333/112 |
| 3,934,213 A | 1/1976 | Stuckert | | |
| 5,058,198 A * | 10/1991 | Rocci et al. | ............ | 725/149 |
| 5,343,172 A * | 8/1994 | Utsu et al. | ............ | 333/32 |
| 5,425,052 A | 6/1995 | Webster | | |
| 6,066,994 A | 5/2000 | Sheperd | | |
| 6,242,933 B1 * | 6/2001 | Yap | ............ | 324/755 |
| 6,337,571 B2 | 1/2002 | Maddala | | |
| 6,552,523 B2 * | 4/2003 | Huard | ............ | 324/72.5 |
| 6,624,721 B1 | 9/2003 | Hagen | | |
| 6,956,448 B1 | 10/2005 | Willems | | |
| 2002/0158639 A1 | 10/2002 | Nakashiba | | |
| 2004/0046581 A1 * | 3/2004 | Maekawa et al. | ............ | 324/755 |

* cited by examiner

Primary Examiner — Mark Paschall
(74) Attorney, Agent, or Firm — William K. Bucher; Michael A. Nelson

(57) ABSTRACT

A probe comprises a small "consumable" probe substrate permanently mounted to a circuit-under-test. The probe substrate includes a high-fidelity signal pathway, which is inserted into a conductor of the circuit-under-test, and a high-bandwidth sensing circuit which senses the signal-under-test as it propagates along the signal pathway. The probe substrate further includes a probe socket for receiving a detachable interconnect to a measurement instrument. Power is alternatively supplied to the probe by the circuit-under-test or the interconnect. When the interconnect is attached, control signals from the measurement instrument are supplied to the sensing circuit and the output of the sensing circuit is supplied to the measurement instrument. In one embodiment, the sensing circuit uses high-breakdown transistors in order to avoid the use of passive attenuation. In a further embodiment, the sensing circuit includes broadband directional sensing circuitry.

10 Claims, 5 Drawing Sheets

METHOD AND APPARATUS FOR PROBING

FIELD OF THE INVENTION

The present invention relates generally to probes for measurement instruments, and more specifically to probes that are mounted to a circuit-under-test.

BACKGROUND OF THE INVENTION

Probes are used to make contact with circuits-under-test. For example, if an electrical engineer wants to observe the signal activity on a circuit board trace, the engineer may select an active, high-impedance probe such as a P7260 from Tektronix, Inc. of Beaverton, Oreg. When the engineer touches the probe's fine tip to the trace, a high input-impedance probe amplifier in the probe tip senses the signal and sends a buffered replica to an oscilloscope for display.

Designing a probe for high-speed microelectronic circuits is very challenging. The ideal probe is easy to connect to the circuit-under-test and has high input-impedance (high resistance, low inductance, and low capacitance). Unfortunately, most common techniques used to make probes easy to connect to the circuit-under-test result in excess inductance and capacitance, thereby spoiling the measurement bandwidth and fidelity of the probe. Furthermore, each time a user touches the probe tip to the trace, the user may approach it from a slightly different angle or exert a slightly different force, resulting in slightly different contact resistance, inductance and capacitance and therefore unrepeatable measurements. Soldering the probe tip to the trace or using a mechanical probing arm may alleviate these problems somewhat, but not entirely. These challenges only get worse as microelectronic circuits get smaller and faster.

Other challenges to probing a signal are that the probe amplifier input voltage range may be smaller than the voltage of the signal-under-test and that the input capacitance of the probe amplifier may be undesirably high. To alleviate these problems, probes use passive attenuators to attenuate the signal-under-test before it is amplified, thereby reducing the voltage applied to the probe amplifier and making the input capacitance seen from the probe tip smaller by a factor equal to the attenuation ratio. Unfortunately, these passive attenuators result in increased expense, complexity, and equivalent noise at the input.

A further challenge is that in some cases the user does not see a true representation of the transmitted signal unless the trace is probed at particular locations. For example, if the trace is a source terminated transmission line, the probed signal appears distorted unless the trace is probed at the very end of the transmission line, or at the immediate input to the receiver. This is due to the fact that on a source terminated transmission line the transmitted signal (the "forward" or "incident" wave) reflects from the far end of the line and propagates back toward the transmitter (the "reverse" or "reflected" wave); however, the sum of the forward and reverse waves (what the probe actually observes) appears distorted everywhere except at the very end of the transmission line. Unfortunately, the input to the receiver is not generally accessible for probing; it may be, for example, contained within a packaged integrated circuit. A related challenge is in verifying the termination quality of a load-terminated transmission line. Here, the object is to verify that all of the data transmitted to a receiver is absorbed, or equivalently that no data is reflected. As such, the user wants to measure the reflected wave without the incident wave, and for the same reason as was discussed above, a conventional probe is insufficient. Similarly, in the case of a bidirectional communications link, if the user wants to measure only signals traveling in a particular direction across the link, a conventional probe is again insufficient because it measures the summation of signals traveling in both directions.

One way to separate forward and reverse waves is to use a directional coupler. A typical directional coupler is a 4-port passive microwave circuit such as the BDCA1-7-33 from Mini-Circuits of Brooklyn, N.Y. If the BDCA1-7-33's port 1 and port 2 are inserted into the conductor of a circuit-under-test, a portion of the forward wave traveling from port 1 to port 2 appears at port 3, and a portion of the reverse wave traveling from port 2 to port 1 appears at port 4. Unfortunately, these types of directional couplers are narrowband and are therefore not suitable for measuring broadband data signals. For example, the BDCA1-7-33 is only suitable for signals between 1.6 GHz and 3.3 GHz. This is insufficient to measure modern broadband serial data signals such as 3.125 Gb/s XAUI (Extended Attachment Unit Interface) which typically has frequency content from DC to well beyond 3.125 GHz.

U.S. Pat. No. 3,934,213 describes other types of directional couplers that use amplifiers to measure and algebraically combine the currents and voltages on a transmission line in order to form representations of the forward and reverse waves. This approach takes advantage of the fact that the voltages and currents in forward waves are in-phase while the voltages and currents in reverse waves are 180 degrees out-of-phase. These directional couplers are broadband in that they operate from DC up to the bandwidth of the technology used. Unfortunately, they require measurements from several points on a transmission line and in some cases even cutting the transmission line to make a series measurement. Thus, these types of directional couplers are not naturally suited to conventional hand-held probing techniques.

What is desired is a high-bandwidth, high-fidelity probe that is easy to connect to microelectronic traces and provides repeatable measurements. It is further desired that the probe have a reasonable input range and low input capacitance while avoiding the expense, complexity, and input noise penalty associated with passive attenuators. It is further desired that the probe have broadband directional sensing capability.

SUMMARY OF THE INVENTION

Accordingly, in the present invention a small "consumable" probe substrate is permanently mounted to a circuit-under-test. The probe substrate includes a high-fidelity signal pathway which is adapted to be inserted into a conductor of the circuit-under-test and a high-bandwidth sensing circuit which senses a signal-under-test as it propagates along the signal pathway. The probe substrate further includes a probe socket for receiving a detachable interconnect to a measurement instrument. Power is alternatively supplied to the probe by the circuit-under-test or the interconnect. When the interconnect is attached, control signals from the measurement instrument are supplied to the sensing circuit and the output of the sensing circuit is supplied to the measurement instrument. In one embodiment the sensing circuit uses high-breakdown transistors in order to avoid passive attenuation. In a further embodiment the sensing circuit includes broadband directional sensing circuitry.

The objects, advantages and other novel features of the present invention are apparent from the following detailed description when read in conjunction with the appended claims and attached drawing.

DETAILED DESCRIPTION OF THE INVENTION

Figure 1:
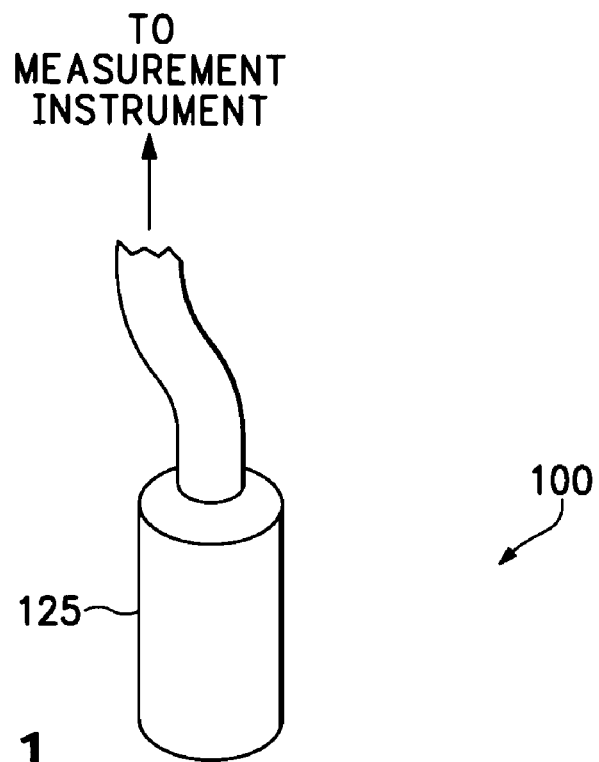
FIG. 1 is an exploded simplified perspective view of a probe according to the present invention.
Figure 1:
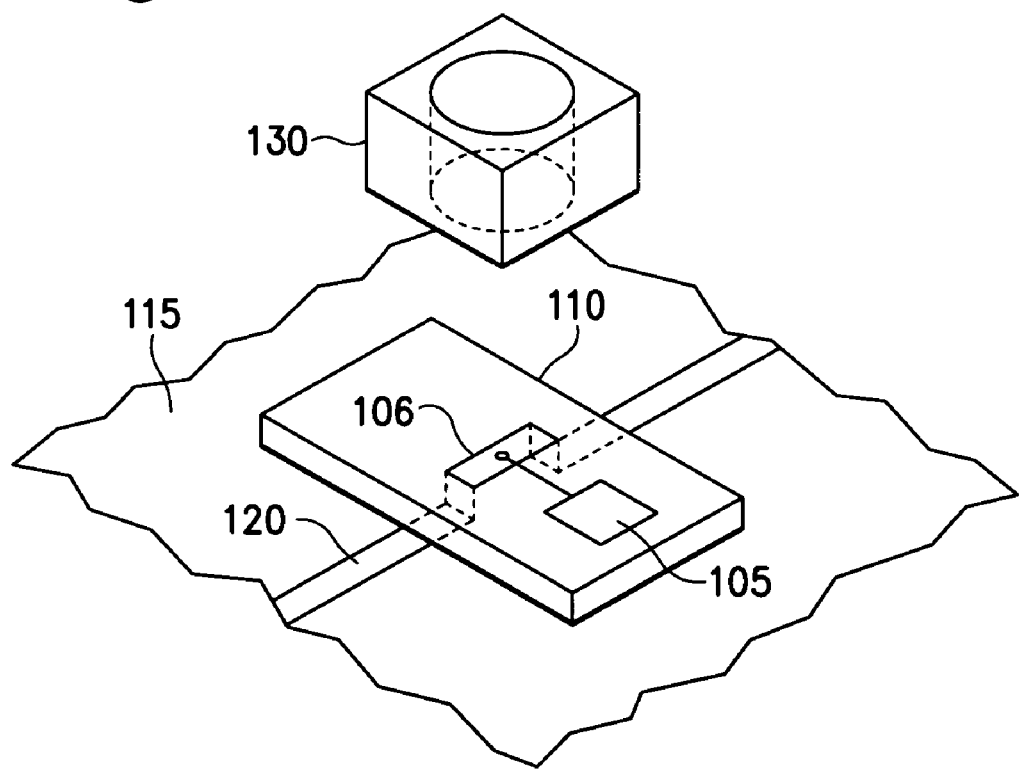

FIG. 1 provides a simplified view of a probe 100 according to the present invention. The probe 100 comprises a small "consumable" probe substrate 110 permanently mounted to a circuit-under-test 115. The probe substrate 110 includes a high-fidelity signal pathway 106 which is inserted into a conductor 120 of the circuit-under-test 115 and a high-bandwidth sensing circuit 105 which senses a signal-under-test as it propagates along the signal pathway 106. The probe substrate 110 further comprises a probe socket 130 for receiving a detachable interconnect 125 to a measurement instrument (not shown). Power is alternatively supplied to the sensing circuit 105 by the circuit-under-test or the interconnect 125. When the interconnect 125 is attached, control signals from the measurement instrument are supplied to the sensing circuit 105 and an output of the sensing circuit is supplied to the measurement instrument.

Figure 2:
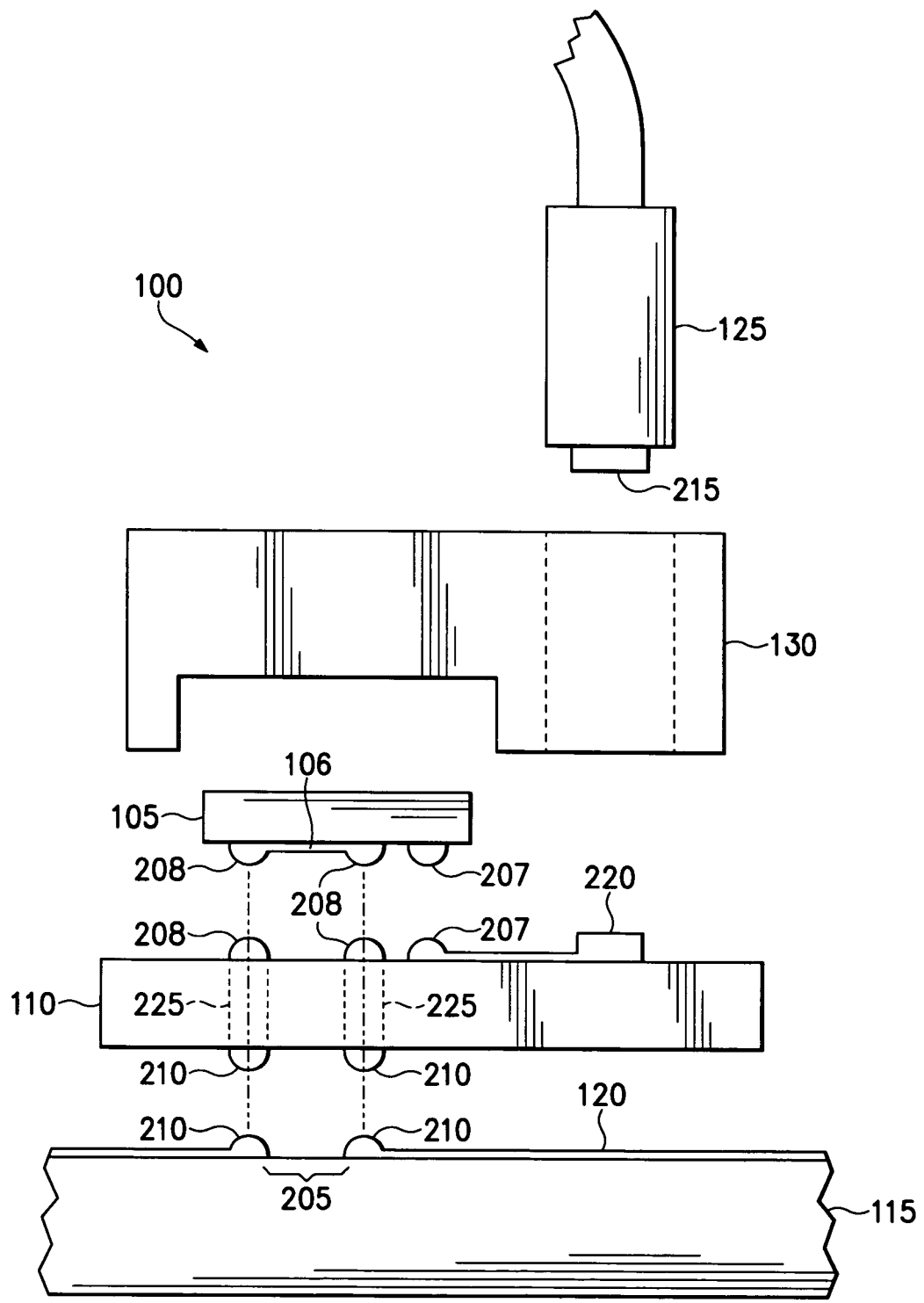
FIG. 2 is an exploded side view of a probe according to the present invention.

FIG. 2 provides a more detailed side view of the probe 100. The sensing circuit 105 is an integrated circuit mounted face-down on the probe substrate 110 using flip-chip solder bump technology, which is in turn mounted to the circuit-under-test 115 using solder bumps. The conductor 120 includes a gap 205 for receiving the probe substrate 110, which is preferably designed into the circuit-under-test 115 during the design phase. In addition to the solder bumps 210 and 208 required to insert the signal pathway 106 into the conductor 120, additional solder bumps (not shown for simplicity) may be required for mechanical stability and impedance control. The probe socket 130 (which is coupled to the probe substrate 110 by any suitable means, e.g. epoxy) secures the interconnect 125 so that its tip 215 contacts a pad 220 which in turn contacts solder bumps 207 and ultimately the sensing circuit 105. While the solder bumps 207, pad 220, and tip 215 are depicted as one path for simplicity from a side view, they may comprise multiple paths in order to accommodate additional signals such as power and control (e.g. gain and offset). Both the probe substrate 110 and the circuit-under-test 115 may comprise a variety of dielectric materials such as conventional glass reinforced epoxy (also known as "FR-4") or alumina (typically used in high frequency applications). Other packaging technologies (e.g. Surface Mount Technology) may be used to mount (i.e. physically and electrically connect) the sensing circuit 105 to the probe substrate 110 and likewise the probe substrate 110 to the circuit-under-test 115. Also, the sensing circuit 105 may be realized with discrete components mounted directly to the probe substrate 110.

In operation, the signal-under-test flows from the conductor 120 up through the solder bumps 210 and 208 and vias 225 to the signal pathway 106 and then back down to the conductor 120. In one embodiment of the present invention, the sensing circuit 105 receives power and control signals from the measurement instrument through the interconnect 125. Accordingly, when the interconnect 125 is not attached, the sensing circuit 105 is un-powered and the signal-under-test simply flows along the signal pathway 106. When the interconnect 125 is attached, power is applied to the sensing circuit 105, and in response the sensing circuit 105 senses the signal-under-test and sends a signal representative of it to the measurement instrument. In an alternative embodiment, the sensing circuit 105 obtains power and control signals from the circuit-under-test 115; thus, the sensing circuit 105 is not necessarily un-powered in the absence of the interconnect 125.

The signal pathway 106, solder bumps 210 and 208, and vias 225 are designed to maintain the characteristic impedance of the conductor 120, thereby minimally loading the circuit-under-test 115 and providing high-fidelity measurements. Furthermore, since the probe substrate 110 is always connected to the conductor 120 in the same manner (e.g. solder reflow) the present invention provides more consistent contact resistance, inductance, and capacitance and therefore more repeatable measurements than a conventional hand-held probe.

The probe substrate 110 and probe socket 130 are "consumable." That is, they are designed to be purchased in quantity and permanently mounted to many anticipated test points on the circuit-under-test 115. When the user wants to probe one of these test points, the user simply attaches the interconnect 125 to the appropriate probe socket and probe substrate. In this manner, the probe 100 is easy to connect to the circuit-under-test 115 and yet provides for repeatable, high-bandwidth, high-fidelity measurements.

A further advantage of the present invention is that the inherent capacitance of the circuit-under-test 115 protects the sensing circuit 105 from damage due to electro-static discharge (ESD). That is, a conventional hand-held probe must include ESD protection circuitry at the probe tip, but at the cost of excess capacitance which spoils the measurement bandwidth and fidelity of the probe. However, given that the probe substrate 110 is permanently mounted to the circuit-under-test 115 (the mounting having been performed in a static controlled environment) the sensing circuit 105 may rely on the inherent capacitance of the circuit-under-test 115 for protection from ESD. As a result, the sensing circuit 105 may use less ESD protection circuitry and thereby offer superior measurement bandwidth and fidelity.

One aspect of the present invention is a recognition that certain types of modern high-performance transistors have low enough input capacitance and high enough breakdown voltage that they may be used as probe input devices. "High breakdown" transistors typically have poor bandwidth, but recent semiconductor processes such as Silicon Germanium 7HP from IBM Corporation of White Plains, N.Y. produce high breakdown transistors with low input capacitance, high breakdown voltage, and high bandwidth. Accordingly, the sensing circuit 105 may use high-breakdown transistors at its input, thereby avoiding the need for a passive attenuator. This makes it possible to avoid the excess capacitance and complexity of a passive attenuator, makes it possible to use less expensive packaging technology that does not have attenuator resistor technology, and provides decreased equivalent noise at the probe tip, all of which make it practical for the probe substrate 110 to be a "consumable" product.

In the preceding discussion, the conductor 120, solder bumps 210 and 208, vias 225, and signal pathway 106 are depicted as single-ended traces for simplicity. However, the conductor 120 may be differential or a multi-trace bus. In such cases, the solder bumps 210 and 208, vias 225, and signal pathway 106 are likewise differential or multi-trace buses with each trace having its own sensing circuit 105.

Figure 3:
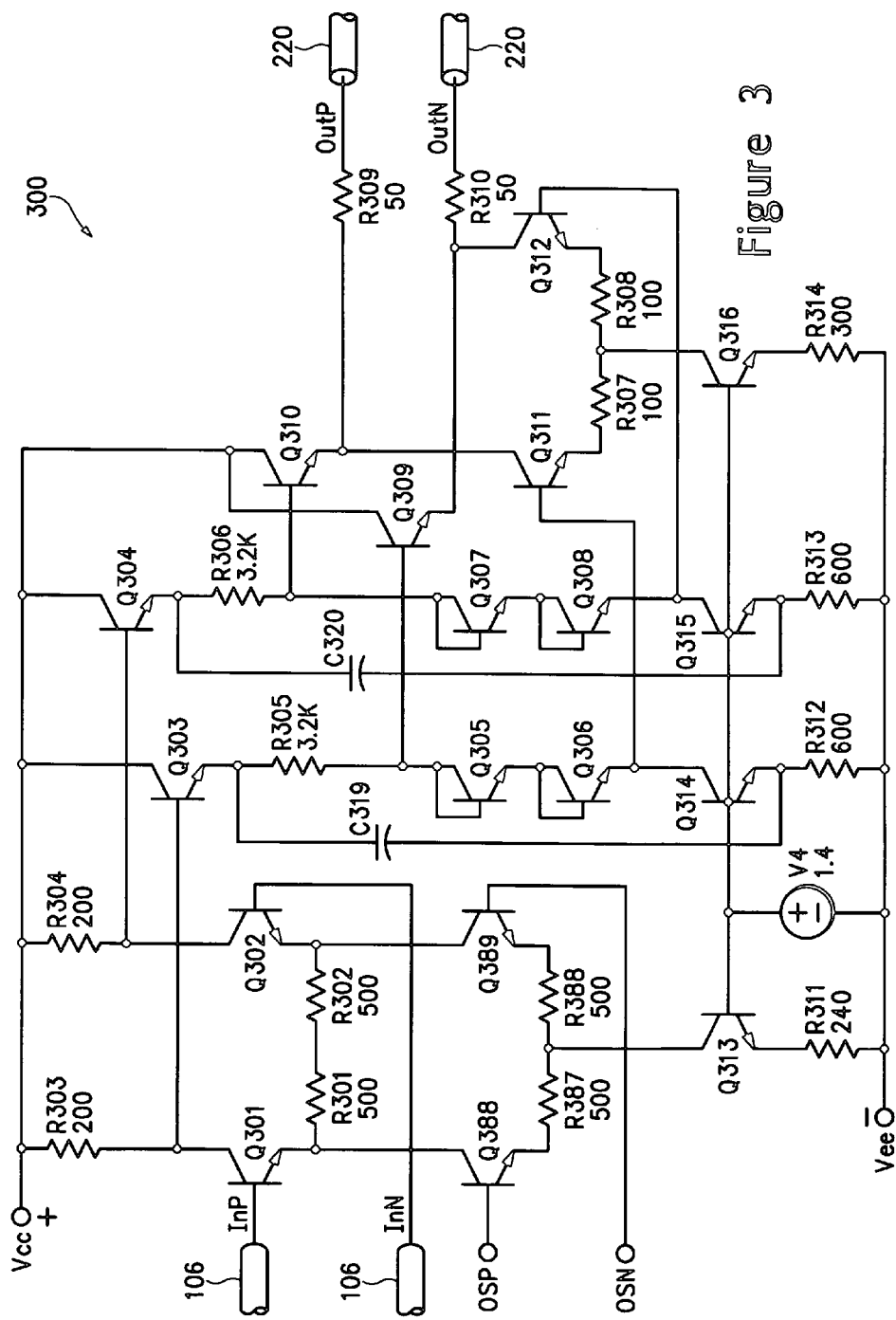
FIG. 3 is a simplified schematic view of a high input-impedance differential amplifier for a probe according to the present invention.

Similarly the sensing circuit 105 may be a high input-impedance single-ended amplifier or a differential amplifier. One such differential amplifier 300 is shown in FIG. 3. Inputs InP and InN connect transistors Q301 and Q302 directly to a differential signal pathway 106. In operation, control signals OSP and OSN pre-bias the tail currents of transistors Q301 and Q302 to provide offset, thereby extending the usable input range. The combination of resistors R301, R302, R303, and R304 produces a differential signal voltage across R303 and R304 which is 0.4 times the input voltage. This differential voltage is level shifted and applied across the bases of transistors Q309 and Q310 which in turn drives outputs OutP and OutN through resistors R309 and R310. When OutP and OutN drive into 50Ω transmission lines, the output voltage is 0.2 times the input voltage. In order to tolerate the common mode voltage range of the input, transistors Q301, Q302, Q388, and Q389 are high breakdown transistors. While the level shifted voltages are applied to the output through Q309 and Q310, the current signal actually goes through capacitors C319 and C320 and transistors Q314 and Q315 and modulates currents in transistors Q311 and Q312 in order to provide the output signal current. Emitter followers Q309 and Q310 only have minor signal currents due to small mismatches or errors. One skilled in the art will appreciate that while this analysis uses a 50Ω characteristic impedance and a 0.2 attenuation ratio, this circuit may be adapted to suit any arbitrary characteristic impedance or attenuation ratio.

Figure 4:
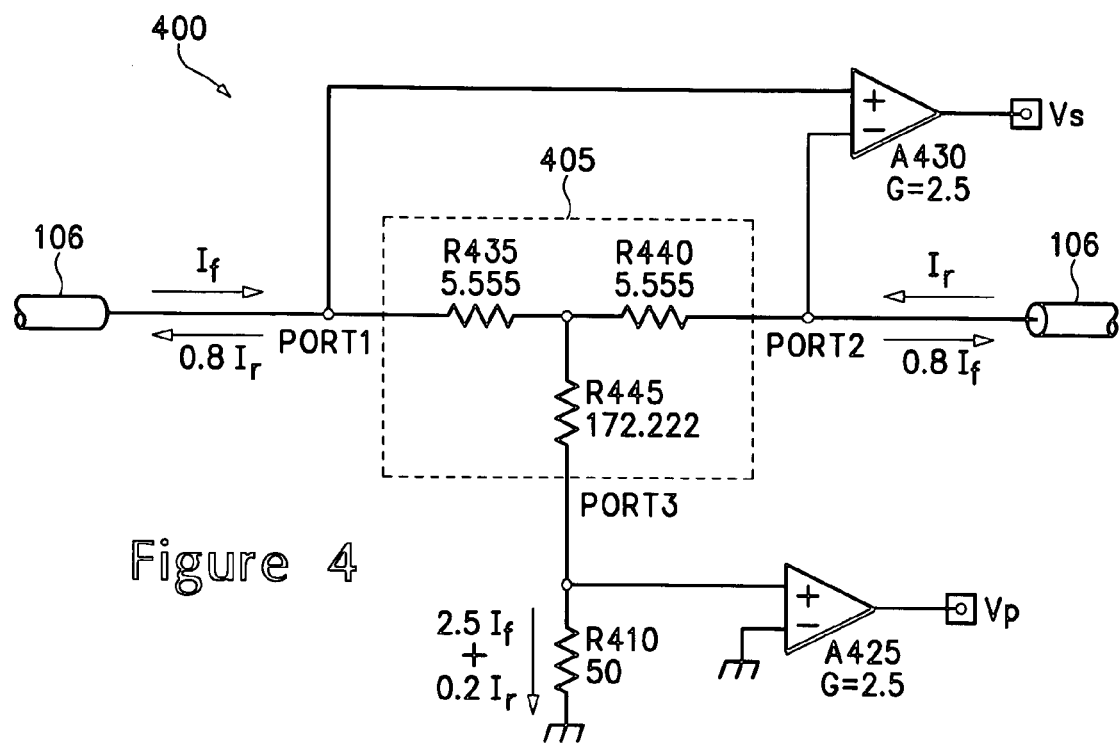
FIG. 4 is a simplified schematic view of a directional sensing circuit for a probe according to the present invention.

Since the probe substrate 110 is permanently attached to the circuit-under-test 115, it is now practical to make measurements which are not easily made with conventional hand-held probes. For example, in another embodiment of the present invention the sensing circuit 105 includes a broadband directional coupler 400 as shown in FIG. 4. A broadband power splitter 405 (comprising resistors R435, R440, and R445) is connected in series with the signal pathway 106, port 1 being the "forward" port, port 2 being the "reverse" port, and port 3 being terminated by R410. Amplifier A425 measures the difference between port 3 and ground with a gain of 2.5 ($V_p$) and amplifier A430 measures the voltage difference between ports 1 and 2 with a gain of 2.5 ($V_s$). The output signals of amplifiers A425 and A430 are added and subtracted to form the forward and reverse waves, respectively. This addition and subtraction may be performed with additional circuitry (not shown) in the sensing circuit 105, in which case the resulting sum or difference signal is delivered to the measurement instrument. Alternatively, the output signals of both amplifiers may be delivered to the measurement instrument, in which case they may be either added and subtracted with circuitry in the measurement instrument, or digitized and then added and subtracted in software.

To understand the circuit operation, consider that the power splitter 405 is symmetrical with respect to ports 1 and 2, and the impedance looking into port 1 or 2 of the power splitter is 50Ω when the other ports are terminated in 50Ω. When a current $I_f$ flows into port 1, a current 0.8 $I_f$ flows out of port 2 and a current 0.2 $I_f$ flows out of port 3. Likewise, by symmetry, when a current $I_r$ flows into port 2, a current 0.8 $I_r$ flows out of port 1 and a current 0.2 $I_r$ flows out of port 3. By defining $$V_f = I_f \times 50\Omega \text{ and } V_r = I_r \times 50\Omega$$

the voltage difference from port 1 to port 2 becomes $$V_s = 0.2 V_f - 0.2 V_r$$

and the voltage at port 3 is $$V_p = 0.2 V_f + 0.2 V_r.$$

Solving for $V_f$ and $V_r$, $$V_f = 2.5(V_p + V_s) \text{ and } V_r = 2.5(V_p - V_s).$$

Thus, the sum and the difference of the output signals of amplifiers A425 and A430 are the forward and reverse signals, respectively.

Figure 5:
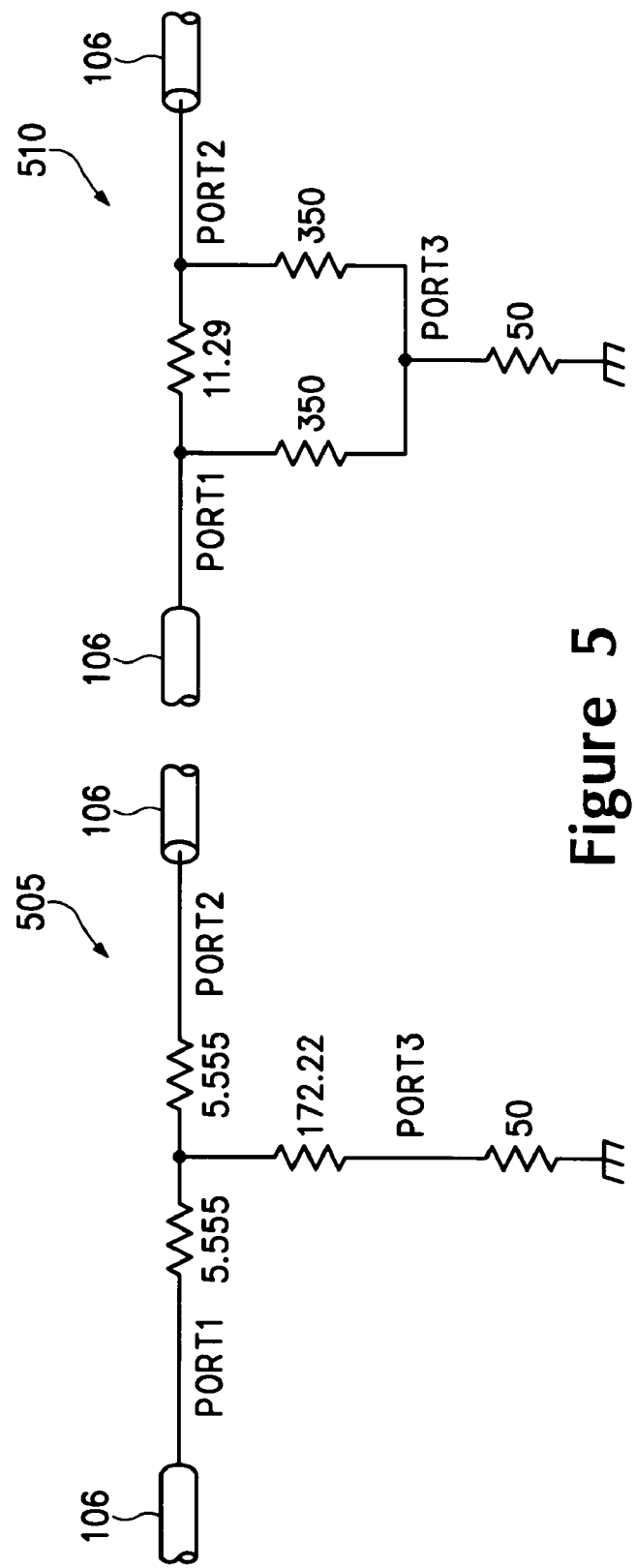
FIG. 5 is a simplified schematic view of "Y" and "Δ" equivalent circuits for a probe according to the present invention.

While the preceding analysis uses a 50Ω characteristic impedance and an attenuation ratio of 0.8, this principle may be applied to any arbitrary impedance or attenuation ratio. Further, the power splitter 405 may be formed on an integrated circuit or printed directly on the substrate 110, and various power splitter circuits are suitable, such as the equivalent "Y" and "Δ" circuits 505 and 510 shown in FIG. 5.

What has been described is a small "consumable" probe substrate and probe socket and a detachable interconnect to a measurement instrument that is easy to connect to microelectronic traces and yet provides high-bandwidth, high-fidelity measurements. In one embodiment a probe according to the present invention uses high-breakdown transistors to provide a reasonable input voltage range and low input capacitance while avoiding the expense, complexity, and input noise penalty associated with passive attenuators. In a further embodiment the probe includes a broadband directional coupler.

What is claimed is:

1. A probe comprising:
   a probe substrate adapted to be mounted to a circuit-under-test, the probe substrate having a signal pathway adapted to be inserted into a conductor of the circuit-under-test;
   a sensing circuit coupled to the signal pathway for sensing a signal-under-test from the conductor; and
   a probe socket coupled to the probe substrate adapted for receiving a detachable interconnect to a measurement instrument, the probe socket and interconnect providing an electrical interface between the sensing circuit and the measurement instrument for the signal-under-test.

2. A probe as recited in claim 1 wherein the detachable interconnect delivers power and control signals from the measurement instrument to the sensing circuit and delivers an output of the sensing circuit to the measurement instrument.

3. A probe as recited in claim 2 wherein the sensing circuit comprises a transistor having a high-breakdown characteristic, an input terminal of the transistor being coupled directly to the signal pathway with no intervening components.

4. A probe as recited in claim 2 wherein the sensing circuit comprises a directional sensing circuit.

5. A probe as recited in claim 4 wherein the directional sensing circuit comprises:
   a power splitter having a first port, a second port, and a third port, the first and second ports being inserted into the signal pathway and the third port being terminated;
   a first amplifier for measuring a voltage difference between the third port of the power splitter and ground;
   a second amplifier for measuring a voltage difference between the first and second ports of the power splitter;
   the sum of the outputs of the first and second amplifiers being the forward signal-under-test; and
   the output of the second amplifier subtracted from the output of the first amplifier being the reverse signal-under-test.

6. A method of probing comprising the steps of:
   mounting a probe substrate having a sensing circuit and a signal pathway to a circuit-under-test such that the signal pathway is inserted into a conductor of the circuit-under-test;
   sensing a signal-under-test from the conductor with the sensing circuit as it propagates across the signal pathway; and coupling a measurement instrument to the sensing circuit with a detachable interconnect, the interconnect being received by a probe socket coupled to the probe substrate, the interconnect and probe socket providing an electrical interface between the sensing circuit and the measurement instrument.

7. A method of probing as recited in claim 6 wherein the coupling step further comprises:

delivering power and control signals from the measurement instrument to the sensing circuit; and delivering an output of the sensing circuit to the measurement instrument.

8. A method of probing as recited in claim 7 wherein the sensing step further comprises sensing the signal-under-test with a transistor having a high-breakdown characteristic, an input terminal of the transistor being coupled directly to the signal pathway with no intervening components.

9. A method of probing as recited in claim 7 wherein the sensing step further comprises directionally sensing the signal-under-test.

10. A method of probing as recited in claim 9 wherein the directional sensing step comprises the steps of:

a. inserting a power splitter in the signal pathway, the power splitter having a first port, a second port, and a third port, the first and second ports being in series with the signal pathway and the third port being terminated;

b. measuring a voltage difference between the third port of the power splitter and ground;

c. measuring a voltage difference between the first and second ports of the power splitter;

d. adding the measurements of steps b and c to form a forward signal-under-test; and e. subtracting the measurement of step c from the measurement of step b to form a reverse signal-under-test.

* * * * *